Jan. 16, 1968 J. S. KILBY 3,364,397

SEMICONDUCTOR NETWORK INVERTER CIRCUIT

Original Filed May 6, 1959

2 Sheets-Sheet 1

INVENTOR
Jack S. Kilby

BY John D. Graham

ATTORNEY

INVENTOR
Jack S. Kilby

BY John G. Graham
ATTORNEY

United States Patent Office 3,364,397

Patented Jan. 16, 1968

3,364,397

SEMICONDUCTOR NETWORK INVERTER CIRCUIT

Jack S. Kilby, Dallas, Tex., assignor to Texas Instruments Incorporated, Dallas, Tex., a corporation of Delaware Continuation of application Ser. No. 352,374, Mar. 16, 1964, which is a continuation of application Ser. No. 811,487, May 6, 1959. This application Jan. 13, 1967, Ser. No. 609,257

7 Claims. (Cl. 317—101)

ABSTRACT OF THE DISCLOSURE

Disclosed is a semiconductor network which functions as an inverter circuit and which is formed from semiconductor material, portions of which may be formed in selected configurations to provide circuit functions.

This application is a continuation of application Ser. No. 352,374, filed Mar. 16, 1964, which was in turn a continuation of application Ser. No. 811,487, filed May 6, 1959, both of which are now abandoned.

This invention relates to a novel miniature semiconductor network or integrated circuit. More particularly, this invention relates to a unique integrated solid state inverter circuit which is fabricated from semiconductor material.

Many methods and techniques for miniaturizing electronic circuits have been proposed in the past. At first, most of the effort was spent upon reducing the size of the components and packing them more closely together. Work directed toward reducing component size is still going on, but has nearly reached a limit. Other efforts have been made to reduce the size of electronic circuits, such as by eliminating the protective coverings from components, by using more or less conventional techniques to form the components of a complete circuit on a single substrate, and by providing the components with a uniform size and shape to permit closer spacings in the circuit packaging therefor.

All of these methods and techniques require a very large number and variety of operations in fabricating a complete circuit. For example, of all circuit components, resistors are usually considered the most simple to form, but when adapted for miniaturization by conventional techniques, fabrication requires at least the following steps:

(a) Formation of the substrate
(b) Preparation of the substrate
(c) Application of terminations
(d) Preparation of resistor material
(e) Application of the resistor material
(f) Heat treatment of the resistor material
(g) Protection or stabilization of the resistor Capacitors, transistors, and diodes when adapted for miniaturization each require at least as many steps in the fabrication thereof. Unfortunately, many of the steps required are not compatible. A treatment that is desirable for the protection of a resistor may damage another element formed on the same substrate, such as a capacitor or transistor, and as the size of the complete circuit is reduced, such conflicting treatments, or interactions, become of increasing importance. Interactions may be minimized by forming the components separately and then assembling them into a complete package, but the very act of assembly may cause damage to the more sensitive components.

Because of the large number of operations required, control over miniaturized circuit fabrication becomes very difficult. To illustrate, many raw materials must be evaluated and controlled, even though they may not be well understood. Further, many testing operations are required and, even though a high yield may be obtained for each operation, so many operations are required that the over-all yield is often quite low. In service, the reliability of a circuit produced by methods of such complexity may also be quite low due to the tremendous number of controls required. Additionally, the separate formation of individual components requires individual terminations for each component. These terminations may eventually become as small as a dot of conductive paint. However, they still account for a large fraction of the usable area or volume of the circuit, and may become an additional cause of circuit failure or rejection due to misalignment.

In contrast to the approaches to miniaturization that have been made in the past, the present invention has resulted from a new and totally different concept for miniaturization. This concept and circuit elements made in accordance therewith are the subject matter of a pending application, Serial No. 791,602, filed Feb. 6, 1959, now Patent No. 3,138,743, issued June 24, 1964, and assigned to the same assignee as the instant application. Radically departing from the teachings of the art, it is proposed in that patent that the ultimate in circuit miniaturization can be attained by using only one material for all circuit elements and a limited number of compatible process steps for the production thereof.

The above is accomplished by utilizing a body of semiconductor material exhibiting one type of conductivity, either N-type or P-type, and processing certain regions thereof so as to form certain kinds of circuit components such as diodes and transistors. Other regions of the basic semiconductor body may inherently perform functions of certain other circuit components such as resistors. According to the principles of the invention of the instant application, all components of a transistor inverter circuit are therefore fabricated within a body of semiconductor material by utilizing the novel techniques described in said patent, together with certain new techniques. All components of this inverter circuit are integrated into the main body of semiconductor material and actually constitute portions thereof.

Of importance to this invention is the concept of shaping. As described in detail in said patent, this shaping concept makes it possible in a circuit to obtain the necessary isolation between components and to define the components or, stated differently, to limit the area which is utilized for a given component. Shaping may be accomplished in a given circuit in one or more of several different ways. These various ways include actual removal of portions of the semiconductor material, specialized configurations of the semiconductor material such as rectangles, L shapes, U shapes, etc., selective conversion of intrinsic semiconductor material by diffusion of impurities thereinto to provide low resistivity paths for current flow, and selective conversion of semiconductor material of one conductivity type to conductivity of the opposite type wherein the P-N junction thereby formed acts as a barrier to current flow. In any event, the effect of shaping is to direct and/or confine paths for current flow, thus permitting the fabrication of circuits which could not otherwise be obtained in a single wafer of semiconductor material. As a result, the final circuit is arranged in essentially planar form. It is possible to shape the wafer during processing and to produce by diffusion the various circuit elements in a desired and proper relationship.

Certain of the subject components described in said patent have utility in and of themselves. However, they perhaps find their greatest utility as integral parts of miniature semiconductor networks. Therefore, it is a principal object of this invention to provide a novel miniaturized semiconductor network device which functions as a transistor inverter circuit.

It is another principal object of this invention to provide a miniature semiconductor network transistor inverter circuit which is fabricated from a body of semiconductor material which contains at least two P-N junctions and wherein all components of the inverter are fabricated completely within the body of semiconductor material.

It is a further object of this invention to provide a unique miniaturized solid state transistor inverter circuit structure which is substantially smaller and more compact than are circuit packages heretofore developeed using known techniques.

It is a further object of this invention to provide a unique miniaturized solid state transistor inverter circuit structure in which a transistor and its output load is formed within one portion of a body of semiconductor material, while the input circuit to said transistor is formed within another portion of the body of semiconductor material.

Other and further objects of the present invention will become more readily apparent from the following detailed description of a preferred embodiment of the present invention when taken in conjunction with the appended drawings in which.

Figures 1, 2:
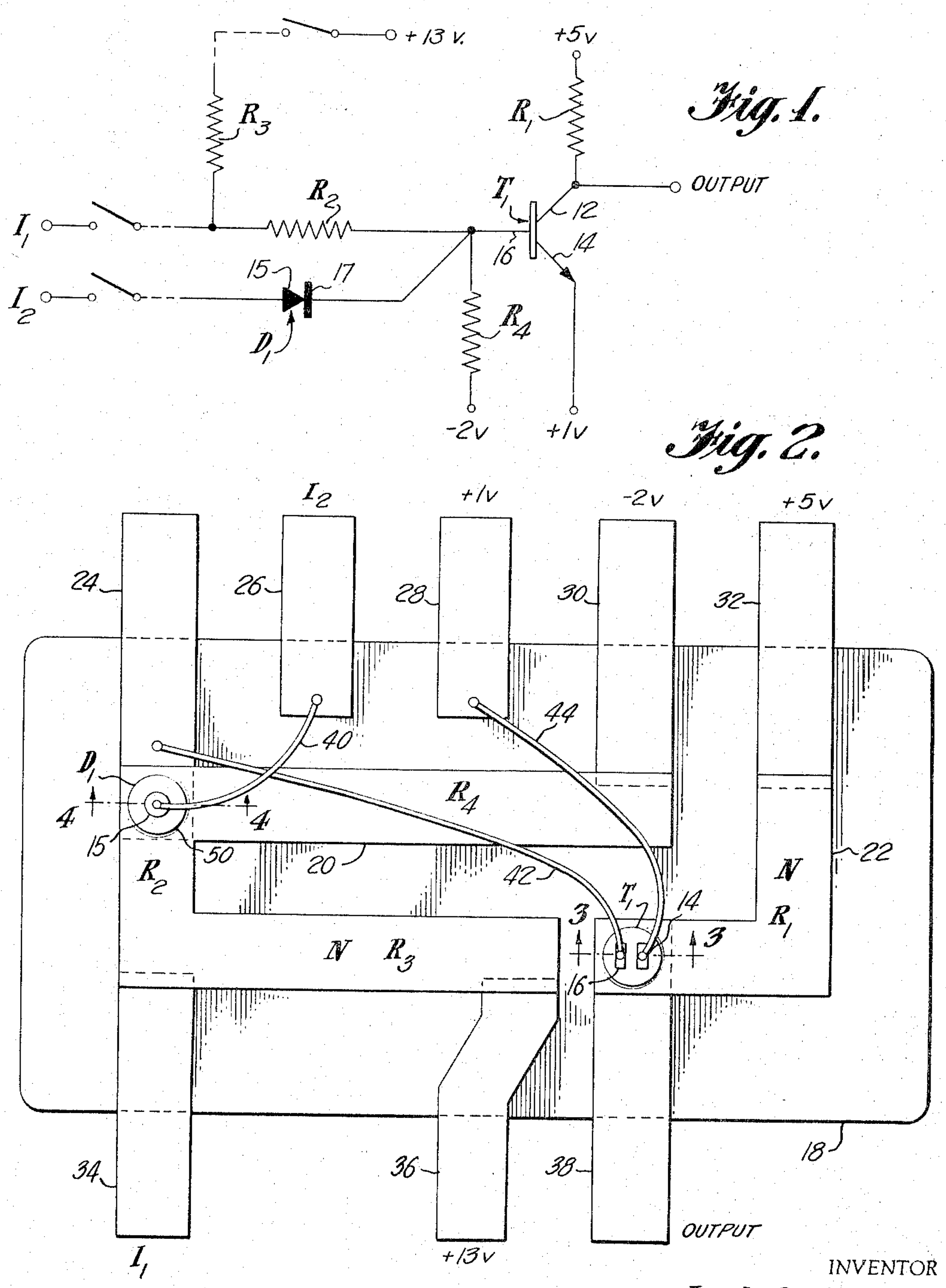
FIGURE 1 is a conventional schematic diagram of the inverter circuit which is to be fabricated within a body of semiconductor material in accordance with the principles of the present invention.
FIGURE 2 illustrates the miniaturized solid state inverter circuit of the present invention.

Referring now to FIGURE 1, there is shown a conventional schematic diagram of the electrical inverter circuit which is fabricated from semiconductor material. The active element $T_1$ is a N-P-N transistor having its collector 12 connected to a load resistor $R_1$ which, in turn, is connected to a source of positive potential. Emitter 14 is connected to another source of positive potential, as shown. Base 16 of transistor $T_1$ is connected to one terminal of resistor $R_4$, the other terminal of which is connected to a low negative potential. Base 16 is also connected to the cathode 17 of diode $D_1$ and to one terminal of resistor $R_2$. The other terminal of $R_2$ is connected to one terminal of $R_3$ which, in turn, may be further selectively connected to a positive potential, depending upon which of the two input leads $I_1$ or $I_2$ is to receive a signal. If input lead $I_2$ is to receive a positive signal, the resistor $R_3$ is not connected to a positive potential. This results in base 16 of transistor $T_1$ being normally biased negatively with respect to emitter 14. In the absence of a positive signal at $I_2$, no current flows in the collector 12 circuit and, thus, the output lead from collector 12 is at a relatively high potential. When a positive signal is applied at $I_2$ to the anode 15 of diode $D_1$, the potential of base 16 becomes positive with respect to emitter 14 so that the voltage at the output lead drops and, thus, inverts the applied signal. No signals are applied to $I_1$ when $I_2$ is being used as the input. However, when it is desired to use input lead $I_1$, lead $I_2$ is not used and resistor $R_3$ is connected to a positive potential. The values of $R_3$, $R_2$, and $R_4$ are such that this normally results in potential of base 16 being higher than potential of emitter 14 so that the collector voltage is low until an appropriate negative signal is applied at input $I_1$. Upon the receipt of such a signal, transistor $T_1$ is turned off and the collector voltage rises, thus inverting the input signal.

Both the passive and active components of the circuit shown in FIGURE 1 are embodied or integrated within portions of a body or chip of semiconductor material, as shown in FIGURE 2. A glass or ceramic substrate 18 is provided to support the semiconductor material used in fabricating the circuit of FIGURE 1. The manner in which the semiconductor material may be supported or attached to the substrate is disclosed in my application for patent, Ser. No. 811,470, filed May 6, 1959, now Patent No. 3,072,832, issued Jan. 8, 1963, concurrently with the original application, Ser. No. 811,487 which application was replaced by continuation application Ser. No. 352,374, both of which are abandoned of which this is a continuation. Two associated portions of an N-type semiconductor material body in the form of wafer strips or chips 20 and 22 are formed on substrate 18. Each wafer strip 20 and 22 is shaped and regions of its surface processed so as to include therein several of the circuit components found in FIGURE 1. The regions of each wafer 20 and 22 have been marked with symbols representative of the circuit element functions that are performed therein which correspond to the components found in FIGURE 1. Metal contact strips 26, 28, 30, 32, 34, 36, and 38 are also attached to the substrate material 18 so as to provide input and output connectors for the bias voltages and signals shown in FIGURE 1. For example, contact strip 26 corresponds to input lead $I_2$ in FIGURE 1 so as to apply a signal thereon to diode $D_1$ which is formed within a region of wafer 20, as will subsequently be described. It will be noted that the end portions of contact strips 30, 32, 34, 36, and 38 are positioned in physical contact beneath various regions of wafers 20 and 22 and so make ohmic connections thereto. However, contact strips 26 and 28 do not extend beneath the wafer strips, but rather are connected to specific components which are fabricated within certain regions of these two wafers. Contact strip 24 is similar in nature to the other above-described contact strips 30–38, except that it is not used to introduce or remove signals from the semiconductor network formed on substrate 18. It corresponds to the junction of base 16, resistor $R_4$, cathode 17 of $D_1$, and resistor $R_2$ which is shown in FIGURE 1. However, it makes ohmic contact with a region of wafer 20, and is utilized as a terminal post and test point within the circuit, as will later be explained.

Figure 3:
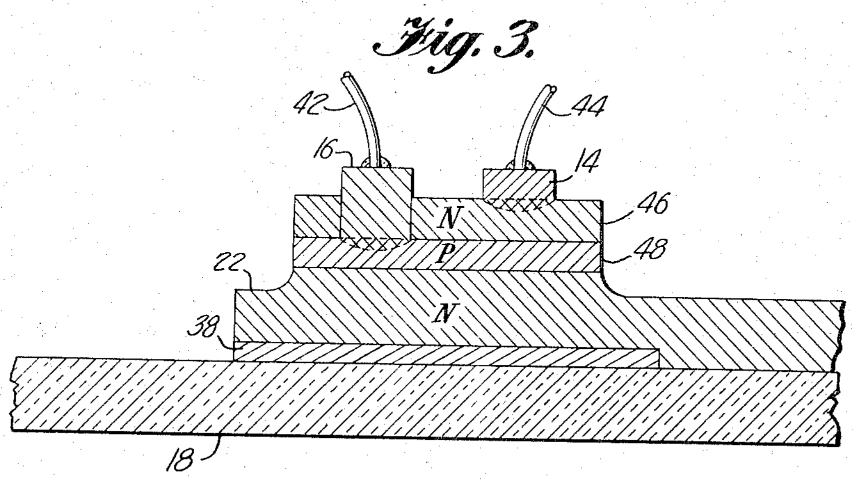
FIGURES 3 and 4 are exaggerated cross sectional views of portions of the solid state inverter circuit shown in FIGURE 2.

The construction and function of wafer 22 in FIGURE 2 will now be explained with particular reference to FIGURE 3. Wafer 22 may be formed in the shape of an L, as shown, and is processed so as to include therein regions providing the functions of resistor $R_1$ and transistor $T_1$ shown in FIGURE 1. Wafer 22 is so designed that the sum of the effective bulk resistances of its horizontal and vertical legs is equal to the desired value of resistance $R_1$. The resistance may be calculated from the following equation:

$$R=\rho L/A$$

where L is the sum of the active leg lengths in centimeters, A is the cross sectional area of the wafer strip and $\rho$ is the resistivity in ohm-centimeters of the N-type semiconductor material in the wafer strip. Transistor $T_1$ is formed or fabricated at the left-hand end of the horizontal leg of wafer 22. The construction of transistor $T_1$ is more readily discerned from FIGURE 3, which is a cross sectional view taken of this left-hand region of wafer 22. As shown, a thin planar layer 48 of P-type semiconductor material is formed on top of the N-type semiconductor material of this region of wafer 22 so as to form a rectifying P-N junction therebetween. Another layer 46 of N-type semiconductor material is deposited on top of P-region 48 so as to create a rectifying P-N junction therebetween. Regions 46, 48, and the left-hand region of wafer 22 thus form an N-P-N transistor at this region of wafer 22. Furthermore, in the particular embodiment as shown, N-region 46 is taken to be the emitter region, while the left-hand region of wafer 22 is considered to be the collector region of the above-identified transistor. A metal emitter electrode 14 is attached to region 46 in a well known manner so as to form an ohmic contact thereto. Furthermore, a metal base electrode 16 is alloyed through region 46 so as to make an ohmic contact with the base region 48. The junction between contact 16 and region 46 may be etched if desired so as to effectively insulate 16 from 46. Contact strip 38 makes ohmic connections with the N-wafer 22 at the regions shown in FIGURES 2 and 3, whereas strip 32 makes ohmic contact as is shown in FIGURE 2 only.

Figure 4:
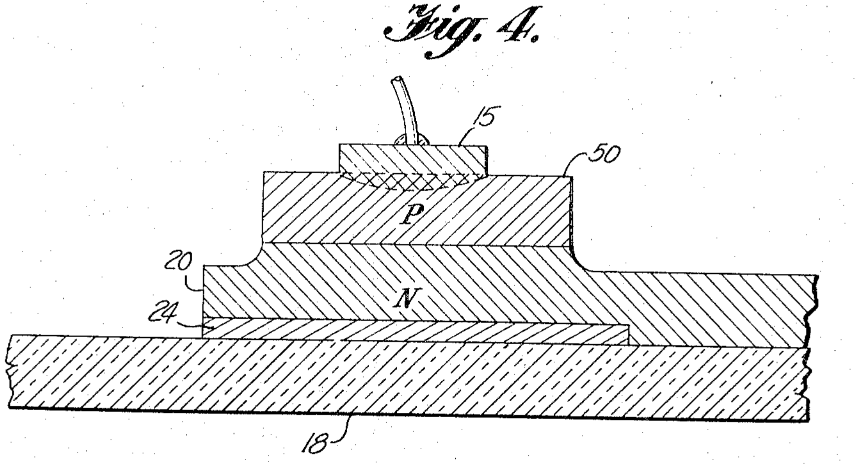

The different regions of wafer strip 20 and the circuit components fabricated therein will now be described with particular reference to FIGURE 4. Wafer 20 is composed of N-type semiconductor material similar to that of wafer 22. The upper horizontal leg of wafer 20 is of such a length and cross sectional area as to provide the desired resistance for resistor $R_4$ shown in FIGURE 1. The lower horizontal leg of wafer 20 in like manner corresponds to resistor $R_3$, while the single vertical leg corresponds to resistor $R_2$. The diode $D_1$ is fabricated in the region found at the intersection of the upper horizontal and vertical legs. FIGURE 4 is a cross sectional view taken of this diode region. As shown in FIGURE 4, a layer 50 of P-type semiconductor material is formed in the above-described region of wafer 20 in such a manner as to form a rectifying P-N junction therebetween. A metal contact 15 is ohmically connected to P-region 50. The processing of the original wafer 20 thus results in a diode $D_1$ being formed whose anode is region 50 and whose cathode is a region of the wafer 20. Contact strips 24, 30, 34 and 36 make ohmic connections with wafer 20 at the regions shown in FIGURE 2.

It has thus been described how wafer strip 22 has regions contained therein which perform the functions of resistance $R_1$ and transistor $T_1$, while wafer strip 20 has regions therein which perform the functions of resistors $R_2$, $R_3$, $R_4$, and diode $D_1$. It now remains to effectively connect the two wafer strips 20 and 22 together so as to form the complete inverter circuit. These final connections are made by ohmic leads 40, 42, and 44. Emitter contact 14 of transistor $T_1$ is connected to contact strip 28 by lead 44. Base contact 16 of $T_1$ is connected by lead 42 to contact strip 24 which, in turn, makes ohmic contact with the upper left-hand region of wafer 20. Anode contact 15 of diode $D_1$ is connected to contact strip 26 by lead 40.

The functioning of the miniature solid state inverter circuit which is fabricated within the semiconductor wafers 20 and 22 will now be described in order to aid in the understanding of its construction. Assuming that input lead $I_2$ is being utilized, the proper bias voltages corresponding to those shown in FIGURE 1 will be connected to contact strips 28, 30, and 32. A positive potential on contact strip 32 is applied to the lower left-hand region of wafer 22, which corresponds to the collector electrode 12 of transistor $T_1$, through the vertical and horizontal legs of wafer 22 which correspond to resistance $R_1$. Contact strip 38 is also connected to this region of wafter 22 so as to indicate the potential at the collector. A negative bias on contact strip 30 is applied to the upper left-hand region of wafer 20 through the upper horizontal leg of wafter 20 which corresponds to resistance $R_4$. Since contact strip 24 is ohmically connected to this upper left-hand region of wafer 20, it is seen that the base electrode 16 of transistor $T_1$ in wafer 22 is therefore connected by lead 42 to one terminal of resistor $R_4$, such as indicated in FIGURE 1. Furthermore, this upper left-hand region of wafer 20 is also utilized as the cathode 17 of diode $D_1$, and it is further seen that contact strip 26 provides an ohmic connection to the anode 15 of diode $D_1$ to which is applied a signal at input $I_2$. As before explained, since input $I_2$ is being utilized, no bias is applied to contact strip 36 so that the lower horizontal leg and vertical leg of wafer 20 are not made effective and can be disregarded. Therefore, a positive signal which is introduced at $I_2$ will cause the potential on contact strip 38 to fall in accordance with the previously described operation of FIGURE 1. However, if input $I_1$ is to be used, then a positive potential is applied to contact strip 36 and, thence, to the upper left-hand region of wafer 20 through its lower horizontal leg and vertical leg, which corresponds to resistors $R_3$ and $R_2$ respectively. Contact strip 34 is connected to the region of wafer 20 which is formed at the junction of the lower horizontal and vertical legs. Thus, a signal at $I_1$ enters the inverter circuit between resistors $R_3$ and $R_2$.

The techniques for processing the wafers 20 and 22 so as to fabricate circuit components therein have been fully described in the afore-mentioned pending application. For example, in order to fabricate the transistor $T_1$ in wafer 22, a diffusion or like process may be used in forming planar P–N junctions between regions 48 and 46, after which the desired area of these regions may be shaped by means of an etching process. Furthermore, the formation of the wafer strips 20 and 22 may be accomplished by initially placing a single body of N-type semiconductor material onto the substrate 18 and thereafter etching away portions thereof so as to form the desired shape of the wafers. This etching also divides the original single body of N-type semiconductor material into several bodies, or wafers, which are thus effectively insulated from each other so as to prevent short circuits between components. However, it is conceivable that the inverter circuit could be fabricated within a single body if the resistance of certain current paths were made so great as to effectively create open circuits. The L and U shapes of the wafers in FIGURE 2 provide compactness.

Although the invention has been shown and described in terms of an inverter circuit utilizing an N-P-N transistor, it will be evident that such a circuit could be fabricated within semiconductor material which employed a P-N-P transistor or other transistors. It will, thus, be evident that such changes and modifications are possible which do not in fact depart from the inventive concepts taught herein. Hence, such changes and modifications are deemed to fall within the purview of the invention, as defined in the appended claims.

Thus, for example, since it is known that intrinsic semiconductor material is characterized by a relatively high order of resistivity, the substrate could be formed thereof; or, the entire unit could be formed from a block of intrinsic semiconductor material into which doping impurities are diffused in the regions occupied by the cut wafers in the drawing. According to this arrangement, member 18 of FIGURE 2 would be either a separate block of intrinsic material on which wafers 20 and 22 were mounted, or it would be part of the same physical piece of semiconductor material as areas 20 and 22, the latter differing therefrom only in electrical characteristics due to impurity doping.

What is claimed is:

1. A solid state semiconductor inverter circuit comprising an insulating substrate, semiconductor material mounted directly on said substrate including a first portion defining a transistor comprised of a base region, an emitter region, and a collector region, a second portion contiguous with the collector region of said transistor defining a load resistance therefor, a third portion defining a diode composed of a region of P-type conductivity and a region of N-type conductivity, a fourth portion and a fifth portion contiguous with one of the regions of said diode, said fourth and fifth portions defining resistors, and means to complete the electrical interconnection of said portions as an inverter circuit.

2. A circuit as defined in claim 1 wherein the insulating substrate is composed of intrinsic semiconductor material.

3. An inverter circuit which comprises semiconductor material forming two contiguous but isolated low resistance paths supported directly on a common base of relatively high resistivity, a base region and an emitter region formed in said material at a point remote from one extremity of one of said paths to form a transistor having a collector terminal adjacent to the base-collector junction in said material at said point, a diode having an anode region and a cathode region at a junction barrier formed in said material at an intermediate point on the second of said paths, separate connections to the extremities of both of said paths, and an ohmic connection between said base region and said intermediate point whereby potentials selectively may bias said emitter region and the extremities of said paths for inversion at said collector terminal of a signal applied to one extremity of said second of said paths or to said anode region.

4. A miniature electronic inverter circuit device of the type including a transistor which has a load resistor connected in its collector circuit and has means for applying signal voltages to its base whereby an inverting function is provided, said device comprising: an insulating substrate, a plurality of thin conductive means positioned directly on one face of said substrate, a plurality of semiconductor chips mounted directly on said one face of the substrate, at least some of said chips each being positioned over at least one of said conductive means, at least one of the chips including collector, base and emitter regions to provide the functions of a junction transistor, said collector region being electrically connected to one of said conductive means which is also connected to one end of a load resistor which extends laterally along said one face of the substrate, the other end of said load resistor being connected to another of said conductive means; the emitter region being electrically connected to a third of said conductive means whereby collector-emitter bias for the transistor may be applied between said another and said third conductive means, and said base region being electrically connected to still another of said conductive means to which input voltages may be applied.

5. A miniature electronic device comprising a body of semiconductor material, a junction transistor provided adjacent one face of the body by alternate layers of semiconductor material of opposite conductivity types providing a collector region, a base region, and an emitter region, a plurality of thin conductive strips secured to said one face of the body with a first of said conductive strips being electrically connected to said collector region at one end, a second of said conductive strips being electrically connected to said base region at one end, a third of said conductive strips being electrically connected to said emitter region at one end, each of said conductive strips extending along said one face of the body for part of its length and being supported solely by said body, each of said conductive strips extending beyond the peripheral edge of said one face of the body for a substantial length thereof to provide means for making electrical connection to said collector, base and emitter regions of the transistor.

6. A miniature electronic device comprising a body of semiconductor material, a junction transistor provided in the body by alternate layers of semiconductor material of opposite conductivity types providing a plurality of p-n junction adjacent one face of the body separating a portion of the body into emitter, base and collector regions of the junction transistor, the emitter and base regions occupying only a limited portion of the total surface area of said one face, a plurality of conductive strips secured to said one face of the body with each of said conductive strips being electrically connected at one end to separate ones of said regions of the junction transistor, each of said conductive strips extending along said one face of the body for a substantial part of its length and being supported solely by said body, each of said conductive strips extending beyond the peripheral edge of said one face of the body for a substantial length thereof to provide means for making electrical connection to a region of the junction transistor.

7. A miniature electronic device comprising a body of semiconductor material, a junction diode provided by semiconductor material of opposite conductivity type adjacent one face of the body with the junction of said diode occupying only a limited portion of said one face of the body, a first elongated conductive strip secured to said one face of the body with the first conductive strip being electrically connected at one end to the semiconductor material of the diode on one side of said junction, a second elongated conductive strip secured to said one face of the body with the second conductive strip being electrically connected at one end to the semiconductor material of the diode on the other side of said junction, each of said conductive strips extending along said one face of the body for a substantial portion of the length of the strip and being supported solely by said body, each of said conductive strips extending beyond the peripheral edge of said one face of the body for a substantial portion of the length thereof to provide means for making electrical connection to the junction diode.

References Cited

UNITED STATES PATENTS

| | | | |
|---|---|---|---|
| 3,115,581 | 12/1963 | Kilby | 317—101 |
| 3,096,466 | 7/1963 | Gossard | 317—101 |
| 2,985,806 | 5/1961 | McMahon. | |
| 2,019,625 | 11/1935 | O'Brien | 174—68.5 |

ROBERT K. SCHAEFER, *Primary Examiner.*

MORRIS GINSBURG, *Assistant Examiner.*